US011342665B1

(12) United States Patent
Reuveni et al.

(10) Patent No.: US 11,342,665 B1
(45) Date of Patent: May 24, 2022

(54) TUNABLE PATCH ANTENNA ARRAY INCLUDING A DIELECTRIC PLATE

(71) Applicant: Skylo Technologies, Inc., Palo Alto, CA (US)

(72) Inventors: Tobi Reuveni, Ariel (IL); Ely Reich, Shoham (IL); Moshe Meir, Mazkeret Batya (IL); Ariel Goldfarb, Tel Mond (IL)

(73) Assignee: Skylo Technologies, Inc., Palo Alto, CA (US)

( * ) Notice: Subject to any disclaimer, the term of this patent is extended or adjusted under 35 U.S.C. 154(b) by 0 days.

(21) Appl. No.: 17/234,848

(22) Filed: Apr. 20, 2021

(51) Int. Cl.
*H03M 1/42* (2006.01)
*H01Q 3/30* (2006.01)
*H01Q 1/22* (2006.01)
*H01Q 1/42* (2006.01)

(52) U.S. Cl.
CPC ............. *H01Q 3/30* (2013.01); *H01Q 1/2283* (2013.01); *H01Q 1/42* (2013.01)

(58) Field of Classification Search
CPC ............................... H01Q 3/30; H01Q 1/2283
USPC ........................................................... 343/872
See application file for complete search history.

(56) References Cited

U.S. PATENT DOCUMENTS

| | | | | |
|---|---|---|---|---|
| 6,664,493 | B2 | 12/2003 | Sabet et al. | |
| 7,239,270 | B2 | 7/2007 | Qi et al. | |
| 2007/0001926 | A1* | 1/2007 | Waltho | H01Q 15/0026 343/909 |
| 2012/0076116 | A1 | 3/2012 | O'Conner et al. | |
| 2021/0184365 | A1* | 6/2021 | Park | H01Q 9/0407 |

* cited by examiner

*Primary Examiner* — Peguy Jean Pierre
(74) *Attorney, Agent, or Firm* — Brian R. Short

(57) ABSTRACT

Apparatuses, methods, and systems for an antenna assembly, are disclosed. One apparatus includes a multiple layer printed circuit board (PCB), a dielectric plate, and antenna elements. The PCB includes antenna excitation feed elements, wherein the antenna excitation feed elements are located on a layer of the PCB. A second surface of the dielectric plate is affixed to a first surface of PCB forming gaps adjacent each of the antenna excitation feed elements, wherein a dielectric constant of the dielectric plate, a thickness of the dielectric plate, and a thickness of the gaps are selected based on an operating frequency of wireless signals communicated through the antenna assembly, and based on RF (radio frequency) characteristics of the PCB. Each of the antenna elements are affixed to a first surface of the dielectric plate.

21 Claims, 13 Drawing Sheets

TUNABLE PATCH ANTENNA ARRAY INCLUDING A DIELECTRIC PLATE

FIELD OF THE DESCRIBED EMBODIMENTS

The described embodiments relate generally to satellite communications. More particularly, the described embodiments relate to systems, methods and apparatuses for a tunable low-profile patch antenna array including a dielectric plate.

BACKGROUND

Current data networks are designed primarily for human users and the network and traffic characteristics that human users generate. The growth and proliferation of low-cost embedded wireless sensors and devices pose a new challenge of high volumes of low bandwidth devices vying for access to limited network resources. One of the primary challenges with these new traffic characteristics is the efficiency at which the shared network resources can be used. For common low bandwidth applications such a GPS tracking, the efficiency (useful/useless data ratio) can often be below 10%. This inefficiency is the result of large volumes of devices communicating in an uncoordinated environment. Addressing this problem is fundamental to the future commercial viability of large-scale sensor network deployments.

It is desirable to have methods, apparatuses, and systems for a tunable low-profile patch antenna array including a dielectric plate

SUMMARY

An embodiment includes an antenna assembly. The antenna assembly includes a multiple layer printed circuit board, a dielectric plate, and a plurality of N antenna elements. The multiple layer printed circuit board includes antenna excitation feed elements, wherein the antenna excitation feed elements are located on a layer of the multiple layer printed circuit board. A second surface of the dielectric plate is affixed to a first surface of multiple layer printed circuit board forming gaps adjacent each of the antenna excitation feed elements, wherein a dielectric constant of the dielectric plate, a thickness of the dielectric plate, and a thickness of the gaps are selected based on an operating frequency of wireless signals communicated through the antenna assembly, and based on RF (radio frequency) characteristics of the multilayer printed circuit board. Each of the plurality of N antenna elements are affixed to a first surface of the dielectric plate, wherein each of the plurality of N antenna elements is located on the first surface based upon a location of at least one of the antenna excitation feed elements.

Other aspects and advantages of the described embodiments will become apparent from the following detailed description, taken in conjunction with the accompanying drawings, illustrating by way of example the principles of the described embodiments.

DETAILED DESCRIPTION

The embodiments described include methods, apparatuses, and systems for an antenna assembly that includes multiple antenna elements, and operates to support satellite communications.

Figure 1:
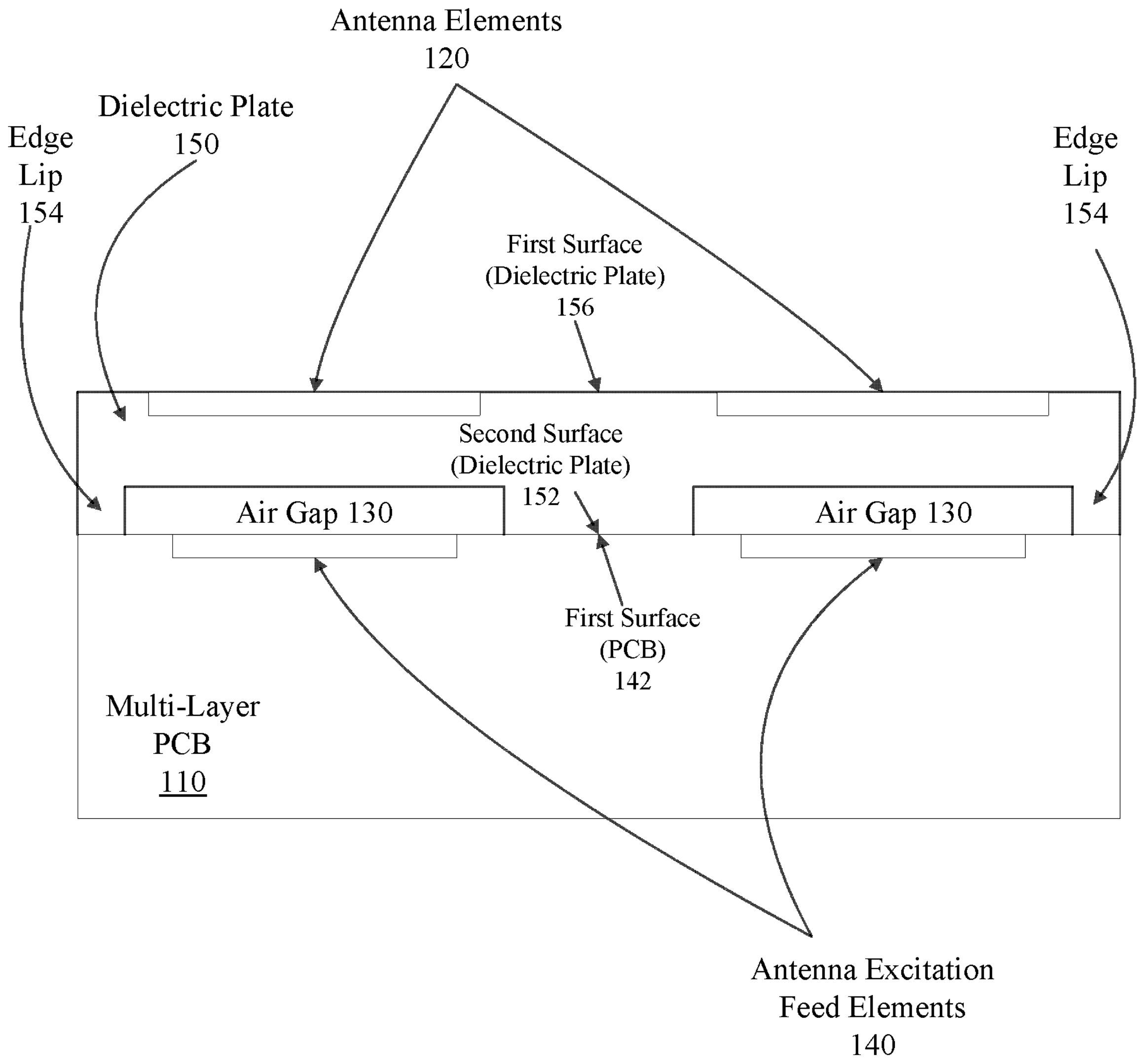
FIG. 1 shows an antenna assembly, according to an embodiment.

FIG. 1 shows an antenna assembly, according to an embodiment. As shown, the antenna assembly includes a multiple layer printed circuit board 110. For an embodiment, the multiple layer printed circuit board 110 includes antenna excitation feed elements 140, wherein the antenna excitation feed elements 140 are located on a layer of the multilayer printed circuit board 110. For an embodiment, the layer is an outer layer of the multiple layer printed circuit board 110, but the layer can alternatively be an inner layer of the multiple layer printed circuit board 110.

As shown, the antenna assembly further includes a dielectric plate 150. For an embodiment, a second surface 152 of the dielectric plate 150 is affixed to a first surface 142 of the printed circuit board 110. For an embodiment, the first surface 142 is the layer (outer layer) in which the antenna excitation feed elements 140 are located. For an embodiment, affixing the second surface 152 of the dielectric plate 150 to a first surface 142 forms (isolated and contained) gaps 130 aligned or adjacent each of the antenna excitation feed elements 140. For an embodiment, the gaps 130 include air gaps. For other embodiments, the gaps 130 can include materials with different characteristics and dielectric constants than air. For an embodiment, the dimensions and orientations of other components of the antenna assembly are based upon the dielectric constant of the gap material.

For an embodiment, a dielectric constant of the dielectric plate 150, a thickness of the dielectric plate 150, and a thickness of the air gaps 130 are selected based on an operating frequency of wireless signals communicated through the antenna assembly and based on RF (radio frequency) characteristics of the multilayer PCB board 110. For at least some embodiments, the RF characteristics of the multilayer PCB board 110 include at least a dielectric constant of the multilayer PCB board and a thickness of the multilayer PCB board 110. At least some other embodiments the characteristics of the PCB 110 further include a number of layers, material composition, copper cleanouts, and/or trace routing of the PCB 110. For an embodiment, the PCB 100 is a common low-cost type of PCB, such as FR4.

As shown, the antenna assembly further includes a plurality of N antenna elements 120. For an embodiment, each of the plurality of N antenna elements 120 is affixed to a first surface 156 of the dielectric plate 150, wherein each of the plurality of N antenna elements 120 is located on the first surface 152 based on a location of at least one of the antenna excitation feed elements 140. For an embodiment, each of the plurality of N antenna elements 120 is aligned (for an embodiment, proximate) with a one of the antenna excitation feed elements 140 to support coupling of the wireless signals between the antenna element 120 and the one antenna excitation feed elements 140. Various embodiments of the antenna excitation feed elements 140 include aperture coupling, micro-strip, and/or coaxial etc.

For an embodiment, each of the N antenna elements 120 is located within (formed within) the dielectric plate 150. For an embodiment, each of the N antenna elements 120 includes a conductive patch. For an embodiment, each of the conductive patches is physically separated from other of the conductive patches by portions of the dielectric plate 150. For an embodiment, a depth of each of the antenna elements (conductive patches) 120 into the dielectric plate 150 is based on a thickness of the antenna element 120. For an embodiment, a surface area of each of the N antenna elements does not protrude past a surface area of the dielectric plate.

For an embodiment, the N antenna elements 120 are physically spaced apart by a fraction of a wavelength of the frequency of wireless signals communicated through the antenna assembly. For an embodiment, the N antenna elements 120 include a square 2×2 array. For an embodiment, each antenna element includes a square conductive patch.

For an embodiment, the dielectric plate 150 includes an edge lip 154 that forms and ensconces each of the air gaps 130 when the second surface 152 of the dielectric plate 150 is affixed to the first layer of multilayer printed circuit board, and wherein formation and physical characteristics of the edge lip 154 includes a compromise between mechanical stiffness of the dielectric plate and RF (radio frequency) performance of the dielectric plate.

Figure 2:
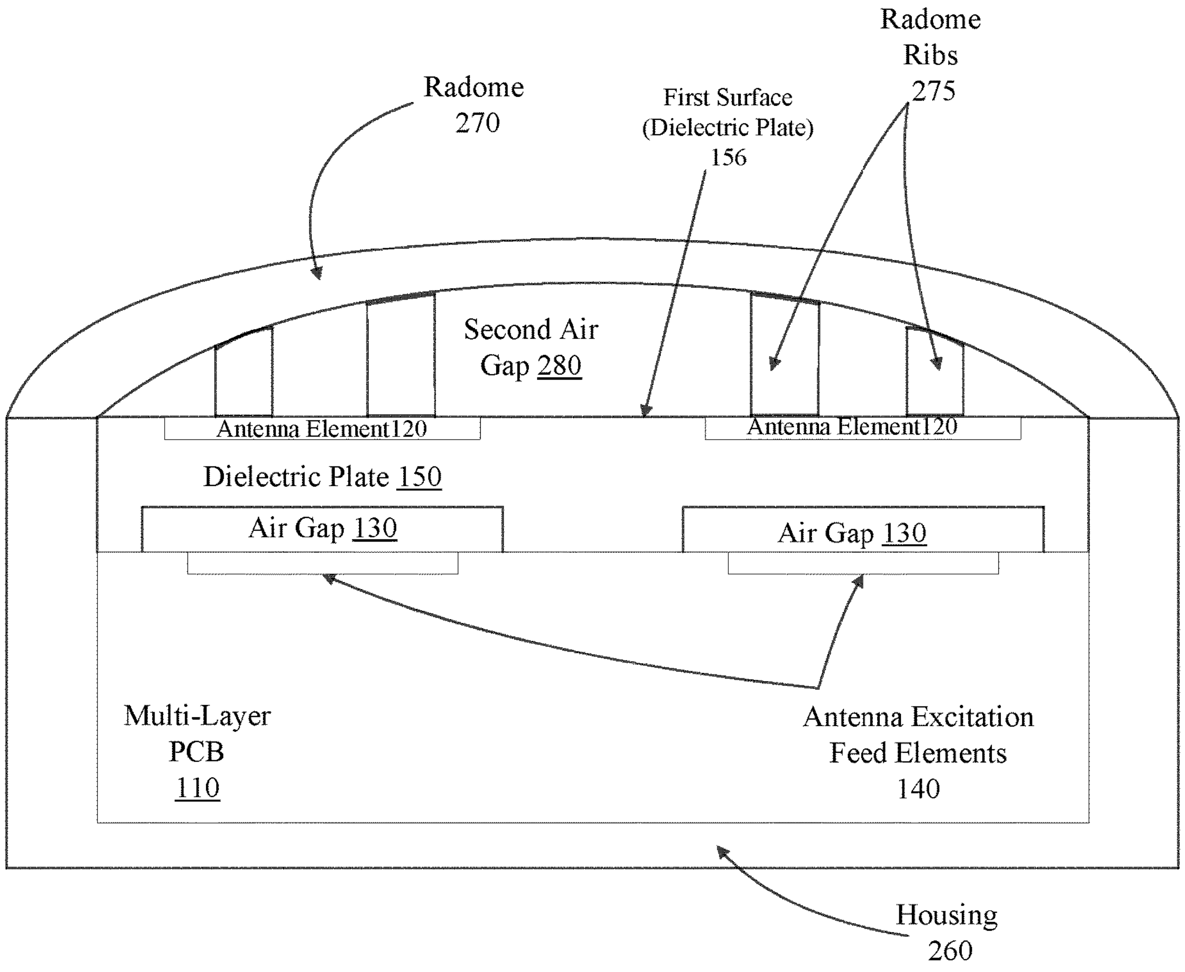
FIG. 2 shows an antenna assembly and radome, according to an embodiment.

FIG. 2 shows an antenna assembly and radome 270, according to an embodiment. For an embodiment, the radome 270 is affixed adjacent to the first surface 156 of the dielectric plate 150, forming a second gap 280 between the radome 270 and the first surface 156 of the dielectric plate 150. For an embodiment, the second gap 280 includes a second air gap. However, for other embodiments, the second gap 280 may include other materials having different characteristics and dielectric constants than air. The radome 20 may be affixed to the dielectric plate 150, or to a house structure 260 that supports the dielectric plate 150 or the printed circuit board 110. For an embodiment, a dielectric constant of the radome 270 and a thickness of the second gap 280 are selected based on the operating frequency of wireless signals communicated through the antenna assembly, and based upon the RF (radio frequency) characteristics of the multilayer PCB board 110. For an embodiment, the radome includes (as part of the radome, wherein, for example, the radome is a single molded piece) supporting ribs/scaffolding (such as, radome ribs 275) to secure the N-antenna elements 120 in fixed, known, and accurate positions with relation to the radome 270 and PCB 110.

For an embodiment, functionally, the ribs 275 provide stability to the assembly structure when the radome 270 has been secured to the dielectric plate 150, the multilayer PCB 110, or the housing 260 that secures the dielectric plate 150 or the multilayer PCB 110. The radome 270 can be secured by attaching the radome with screws. For an embodiment, the radome includes 4 ribs 275 to place the patches (antenna elements 120) in a desired height to make sure the patches are in proper placement. For an embodiment, the ribs 275 are designed so that a surface of the ribs 275 proximate the patches (antenna elements 120) is flat shaped, and a surface proximate the radome 270 follows a curvature of the radome 270. For an embodiment, different ribs 275 have different heights as dictated by the shape (curvature) of the radome 270. Further, for an embodiment, a size and/or width of the ribs 275 is selected based on a size and/or width of the metal patches (antenna elements 120). For an embodiment, the radome ribs 275 and the dielectric plate impact the RF performance of the antenna assembly.

For an embodiment, an antenna gain of the plurality of N antenna elements and steering of an electromagnetic beam formed by the plurality of N antenna elements are augmented by the radome affixed to the dielectric plate. According Snell's law, most of the radiating energy from the antenna elements 120 passes the radome 270, and part of it is reflected back. The ratio of these energies depends on radome material (dielectric constant), thickness, and curvature. For an embodiment, the shape and material used to form the radome 270 are selected based on the frequency of electromagnetic signals being communicated through the antenna assembly.

Figure 3:
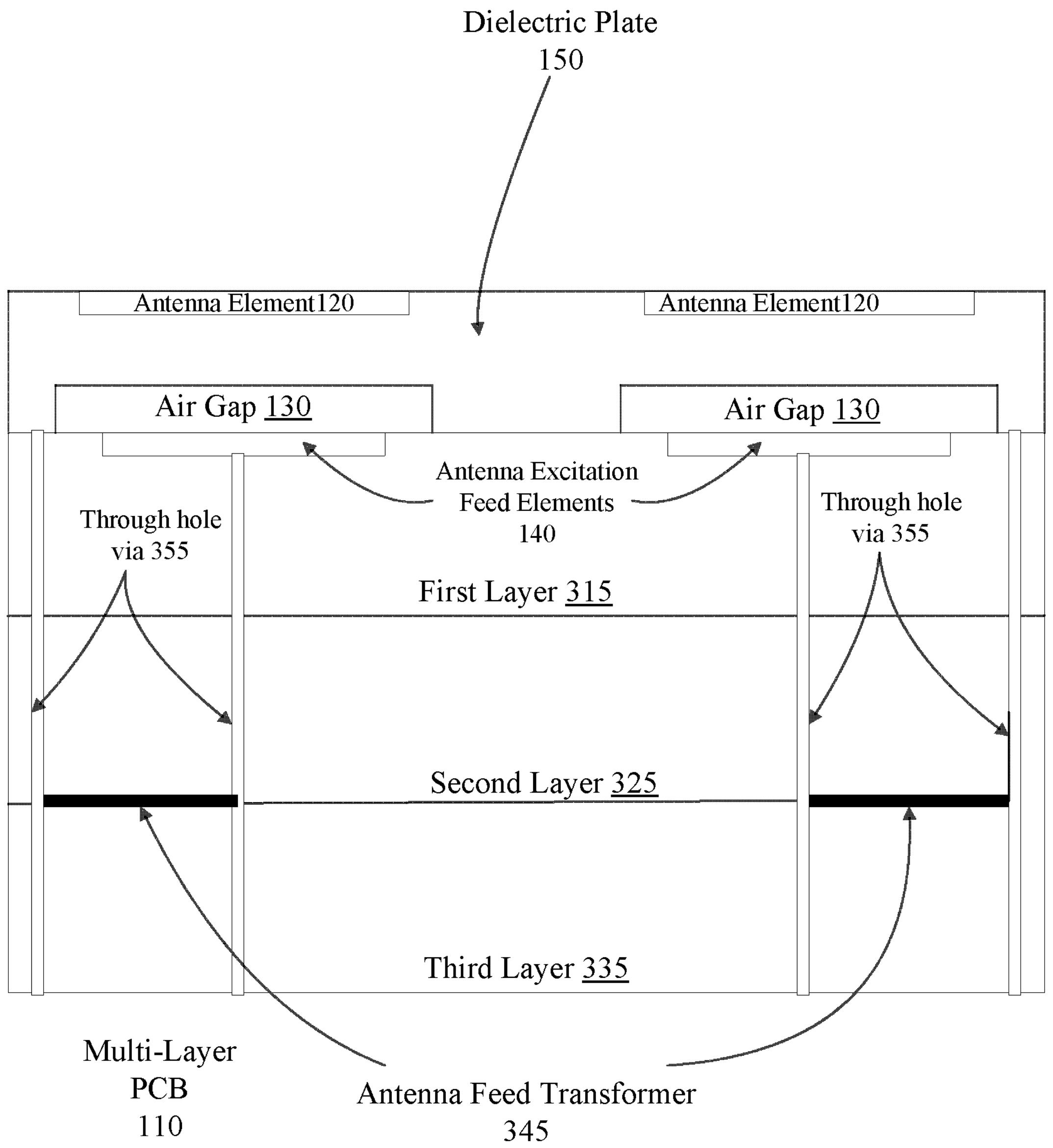
FIG. 3 shows an antenna assembly with additional details of a printed circuit board of the antenna assembly, according to an embodiment.

FIG. 3 shows an antenna assembly with additional details of a printed circuit board 110 of the antenna assembly, according to an embodiment. For an embodiment, a first layer 315 is the previously described outer layer. For an embodiment, the multiple layer printed circuit board 110 further includes a second layer 325 that includes a ground plane. For an embodiment, the multiple layer printed circuit board 110 further includes a third layer 335 that includes antenna feed transformers 345. For an embodiment, each of the antenna excitation feed elements 140 is electrically connected to a one of the antenna feed transformers 345 through a conductive (through hole) via 355. For an embodiment, each of the antenna feed transformers 345 provide impedance matching. That is, the antenna feed transformers 345 provide impedance matching between the antenna elements 120 and one or more radios located within the printed circuit board 110 that are electrically connected to antenna feed transformers.

The multi-layer PCB 110 of FIG. 3 includes three layers 315, 325, 335, but can include any number of two or more layers. For an embodiment, one of the outside layers includes routing traces for carrying RF signals to and from an external radio. At least some of these routing traces are electrically connected to the antenna feed transformers 345 through the through-hole vias 355. For an embodiment, at least one of the layers includes a control layer for routing control signals to or from the conductive vias 355. For an embodiment, the control layer is located between layer 315 (outer layer) and layer 315 (GND).

For an embodiment, the antenna feed transformers 345 are located an external surface of third layer 335. For an embodiment, the antenna feed transformers are designed based upon the impedance of the elements as reflected in the through hole via plane at third layer 335 and based upon the thickness of third layer 335.

For at least some embodiments, the through-hole vias 355 pass through all of the layers of the multi-layer PCB 110 from one outside layer of the multi-layer PCB 110 to the other outside layer of the multi-layer PCB 110. For an embodiment, wireless signals to be transmitted or received are passed between a radio located on the one side of the multi-layer PCB 110 and the excitation feed elements located on the opposite side of the multi-layer PCB 110. Further, at least some of the through-hole vias 355 pass all of the layers of the multi-layer PCB 110 but only electrically connect traces of internal layers of the multi-layer PCB 110.

For an embodiment, the antenna excitation feed elements are distributed over multiple layers of the multi-layer PCB 110. However, for an embodiment, as shown in FIG. 3, the antenna excitation feed element 140 are only located on the external surface the first layer 315.

For an embodiment, the antenna elements 120 operate as radiating elements to enable the propagation of the RF signals. For an embodiment, the antenna elements 120 couple RF (radio frequency) signals to feed elements 140, and the feed elements 140 and the antenna elements 120 in combination operate as radiating elements to enable the propagation of the RF signals.

For an embodiment, the exterior layer (exterior surface of the third layer 335) of the multi-layer PCB 110 130 includes RF (radio frequency) chains operative to process the RF signals. For an embodiment, each of the RF chains is electrically connected to a one of the feed elements 140 through one of the through hole vias 355. For an embodiment, each of the RF chains includes phase shifters (delay lines). For an embodiment, each phase shifter includes a plurality of PCB length routes that are selectable with a switch, wherein settings of the switch are determined by control signals. The RF chains further include RF transmission and reception processing circuitry, such as, amplifiers and frequency converters.

For an embodiment, all of a plurality of plated through hole vias 355 of the PCB 110 (that is, both the RF signal control vias and the control signal vias) extend through the multilayer PCB 110 from a first exterior layer to the second exterior layer 130, wherein vias (such as, via 355) that operate to connect control signals include extended cleanouts on layers of the multilayer PCB that do not include terminations of the control signals. The extended cleanouts electrically insulate the conductive through hole vias from conductive traces located on the layer in which the extended cleanout is located.

As described, through hole vias 355 of the multilayer PCB 110 includes both RF signal vias, and the control signal vias. For an embodiment all of the RF signal vias extend from the first exterior layer to the second exterior layer of the multilayer PCB 110 and electrically connect RF signal circuitry of, for example, the second exterior to the antenna excitation feed element 140 of the first exterior layer multilayer PCB 110. RF signal via clean-outs are located at the locations in which each of the RF signal vias pass through the interior layers. That is, none of the RF signal vias are electrically connected to anything on the interior layers, and the RF signal via clean-outs includes insulating barriers (a lack of conductor) between the RF signal vias and anything located on the interior layers. Further, all of the control signal vias also extend from the first exterior layer and the second exterior layer, but include control signal via clean-outs on the layers of the PCB that the control signal vias are not electrically connected to a termination of the control signals of the control signal vias. It should be noted that for an embodiment, the second exterior layer includes the phase shifter that includes a plurality of PCB length routes that are selectable with a switch, wherein settings of the switch are determined by control signals. Accordingly, at least some of the control signal vias do terminate on the second exterior layer. For at least some embodiments, none of the control signal vias terminate on the first exterior layer, but extend to the first exterior layer and include a control signal via clean-out on the first exterior layer.

Figure 4:
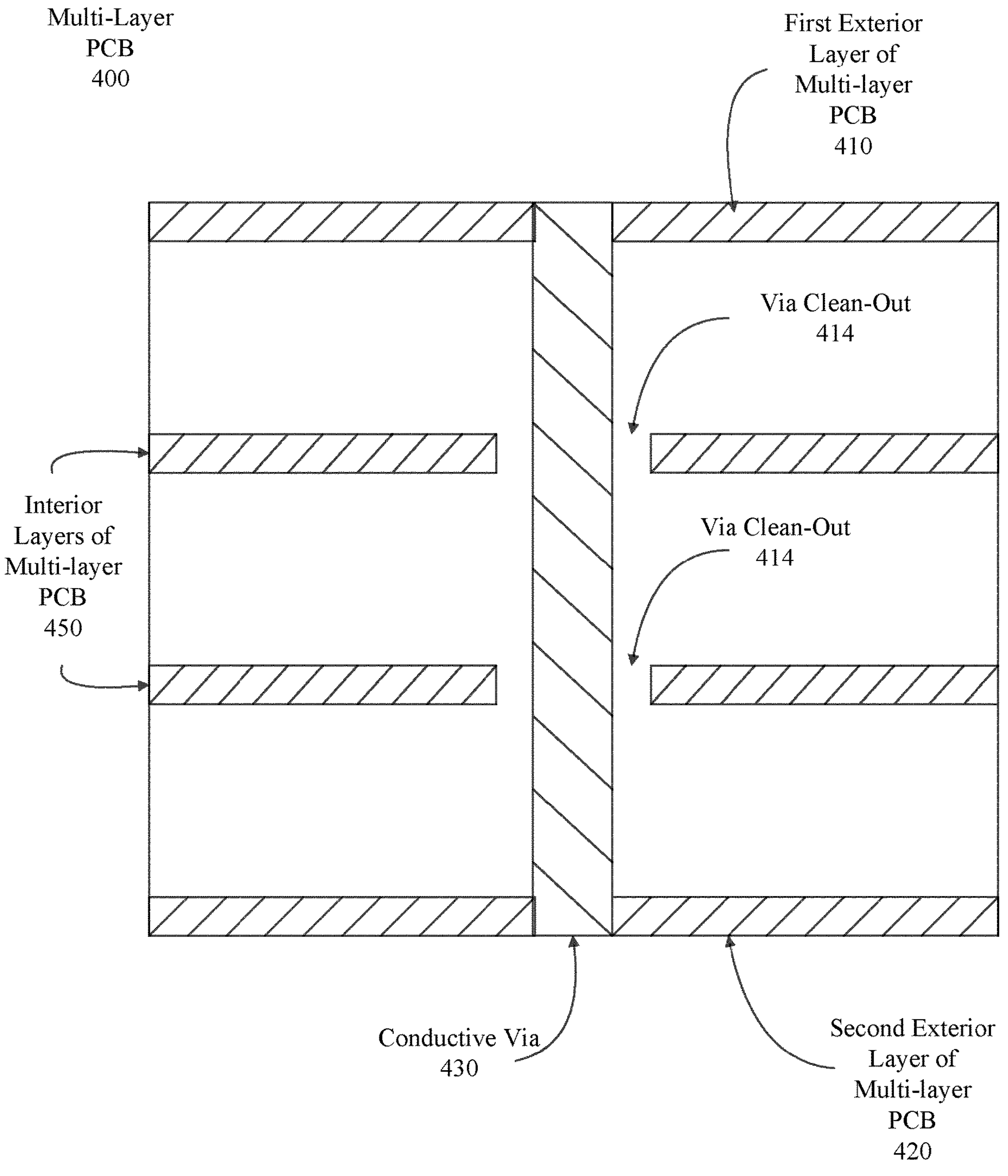
FIG. 4 shows a conductive via of a multiple layer printed circuit board that includes via clean-outs, according to an embodiment.

FIG. 4 shows a plated through hole via 430 of a multiple layer PCB (printed circuit board) 400 that includes via clean-outs 414, according to an embodiment. The plated through hole via 430 electrically connects the first exterior layer 410 of the multi-layer PCB to the second exterior layer 420 of the of the multi-layer PCB. As shown, the exterior layer 410, 420 are exterior to the multi-layer PCB as opposed to the interior layers which are not exposed. As previously described, the first exterior layer 410 includes the multiple antenna elements, and the second exterior 420 layer includes the RF chains and associated phase delay circuitry.

The plated through hole via 430 of FIG. 4 does not electrically connect to the interior layers 450 of the multi-layer PCB. Accordingly, the via clean-outs 414 are located where the plated through hole via 430 passes through the interior layers 450. For an embodiment, the plated through hole via 430 must include RF signals because the plated through hole via 430 electrically connects the first exterior layer 410 to the second exterior layer 420. That is, for an embodiment, the control signal vias always extend to the first exterior layer 410, and always include a via clean-out 414 on the first exterior layer 410. However, the control signal vias may be electrically connected to the second exterior layer 420 for controlling the phase delay.

Figure 5:
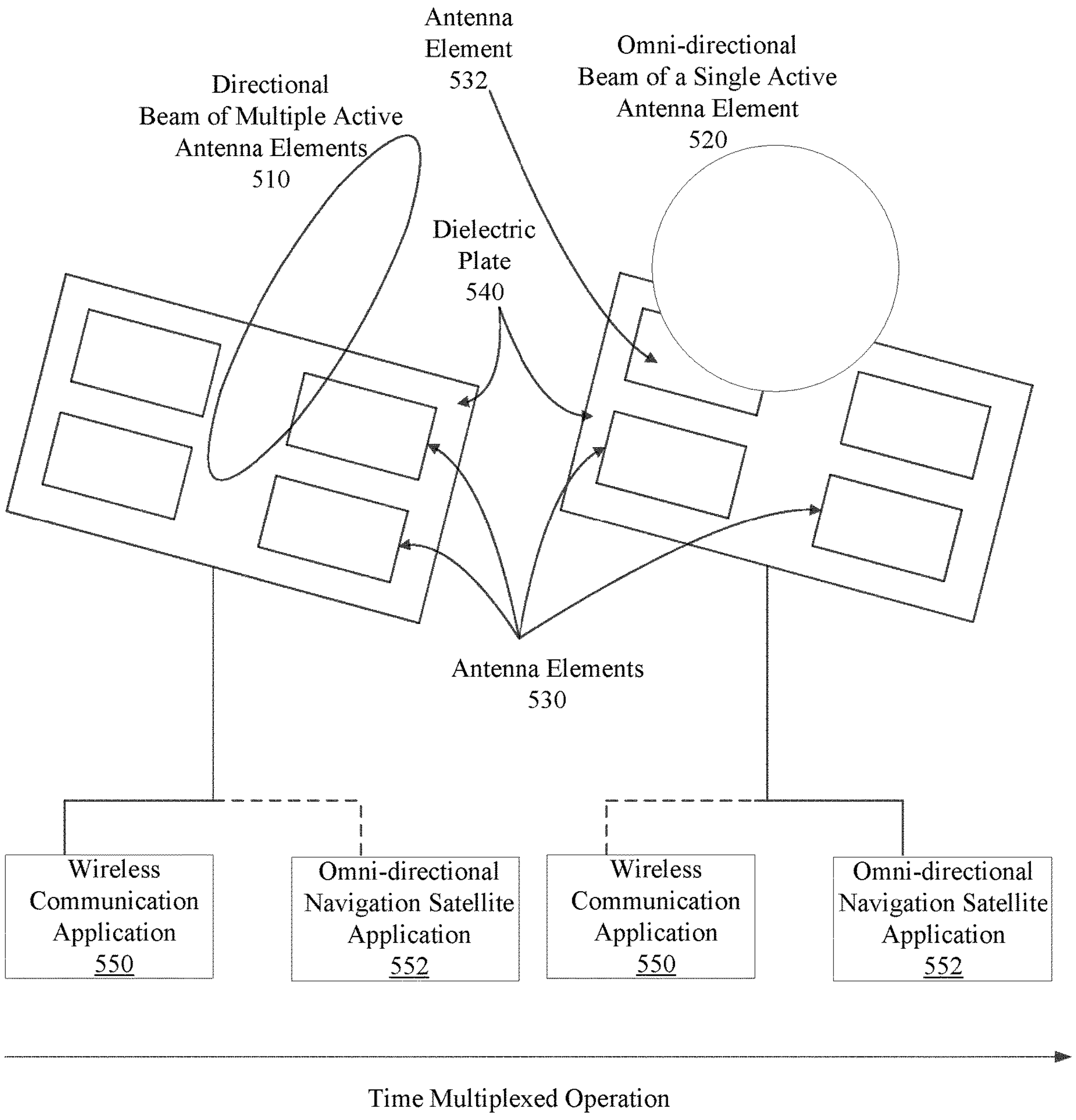
FIG. 5 shows operation of the antenna assembly in a directional mode and an omni-directional mode, according to an embodiment.

FIG. 5 shows operation of the antenna assembly in a directional mode 510 and an omni-directional mode 520, according to an embodiment. For an embodiment, an antenna element 532 of the plurality of N antenna elements 530 of the dielectric plate 540 operates as an omnidirectional antenna (at least as a pseudo omni-directional or non-directional antenna) and other of the plurality of N antenna elements 530 operate as a directional antenna as coordinated through time multiplexing. That is, for an embodiment, the single antenna element 532 of the is controlled to operate independent from the other of the N antenna elements 530. While operating independently, the single antenna element forms an omni-directional type of antenna pattern. For an embodiment, the single antenna element also operates in conjunction with the rest of the N antenna elements 530 to form a directional type of antenna pattern. It is to be understood that while the term “omni-directional” is used, the omni-directional beam is actually more isotropic than the directional beam formed by an array of antenna elements, but not an ideal fully omni-directional antenna pattern. That is, the omni-directional antenna pattern is less directive and more isotropic than the directional antenna pattern.

For an embodiment, the omni-directional type of antenna pattern and the directional type of antenna pattern are time multiplexed. For an embodiment, the directional type of antenna pattern is used while the antenna assembly is facilitating wireless communication with a base station through a satellite. For an embodiment, the omni-directional type of wireless communication is use while the antenna assembly is facilitating wireless reception of satellite navigational signals, such as, GNNS (Global Navigation Satellite Systems) signals. That is, for an embodiment, the omnidirectional antenna operates to receive navigation satellite signals, and the N antenna elements operate as the directional antenna for supporting wireless communication with users.

For an embodiment, the time multiplexing is driven by the sleep/awake cycle of the communication device associated with the antenna assembly and the directional antenna state. When a modem of the communication device is awake and available to communicate, the antenna assembly operates in the directional mode, and when the modem is sleeping (deactivated) the antenna is open to switch to the omnidirectional GNSS type operating mode. As shown, during a wireless communication application 550 the antenna assembly operates in the directional mode, and during a navigation satellite application 552 the antenna assembly operates in the omni-directional mode.

Figure 6:
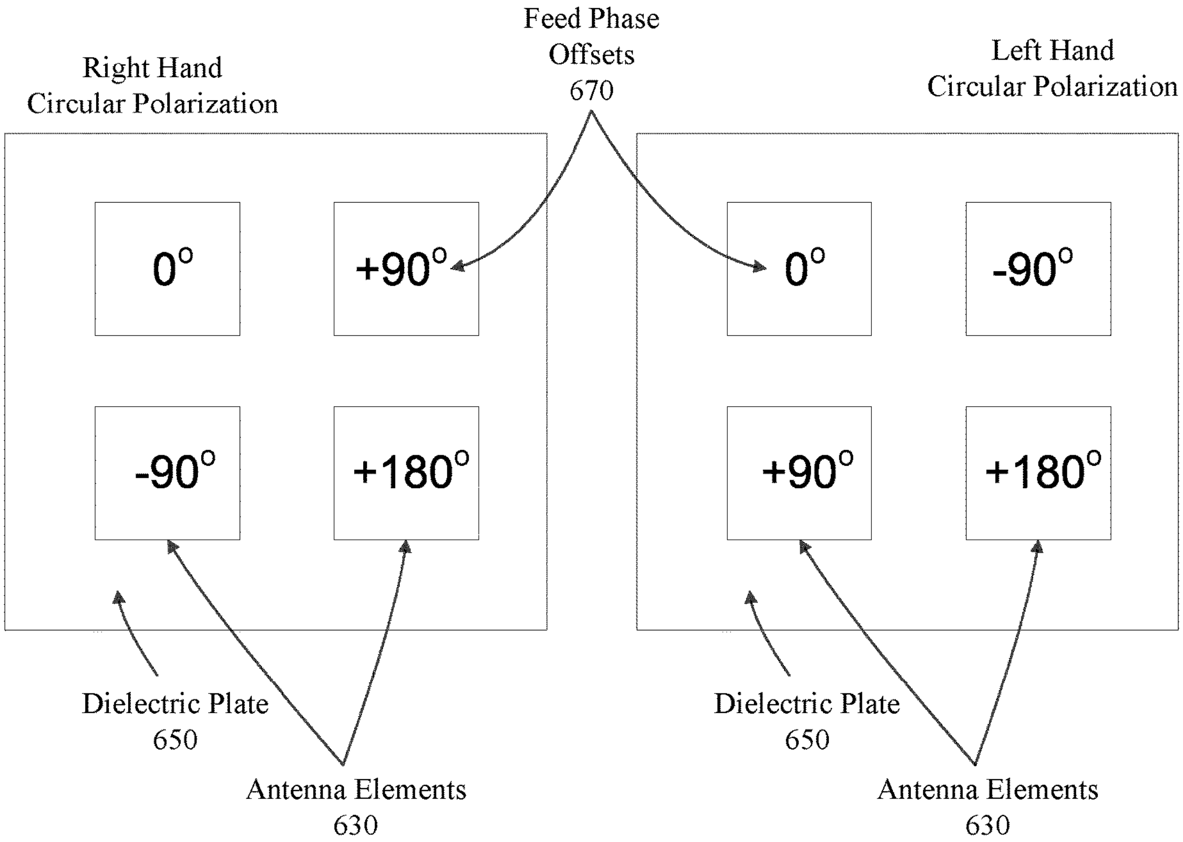
FIG. 6 shows operation of the antenna assembly in a right-hand polarization mode and a left-hand polarization mode, according to an embodiment.

FIG. 6 shows operation of the antenna assembly in a right-hand polarization mode and a left-hand polarization mode, according to an embodiment. For an embodiment, a single antenna element operates as an omnidirectional antenna using RHCP (right hand circular polarization) and the N antenna elements operating as the directional antenna dynamically switch between LHCP (left hand circular polarization) and RHCP. For an embodiment, the antenna assembly dynamically switches that antenna elements between operating in a LHCP mode and in a RHCP mode while maintaining GPS omni antenna in RHCP by leveraging commonalities in opposite direction sequential rotation.

For an embodiment, the antenna elements are conductive patches, and the conductive patches includes two truncated corners, wherein characteristics of the two truncated corners are based on the required RF performances, patch size, required bandwidth, maximum gain.

For an embodiment, the N antenna elements are implemented using sequential rotation. As shown in FIG. 6, both the RHCP and the LHCP configurations utilize feed offsets 670 of the antenna elements 630 of the dielectric plate 650 of 0°, +90°, 180°, and −90°, but as shown, the order is different. As shown, for an embodiment, the plurality of N antenna elements are arranged into 2×2 elements groups. For an embodiment, each antenna element in a group is orthogonal to its neighboring antenna elements, and each antenna element is fed with different length traces for excitation with desired phases (0,90,180,270). That is, different length traces can be selected for time delaying the communication signals to introduce the desired phase. For an embodiment, switching from LHCP to RHCP only requires two phase offsets to change, and the change is in the sign of the phase associated with the phase offsets. Specifically, as shown, the −90° and the +90° feed offset are changed between the LHCP and the RHCP.

As stated, for an embodiment, sequential rotation optionality between LHCP (left hand circular polarization and RHCP (right hand circular polarization) is achieved by adjusting a phase offset of two of four antenna elements. For an embodiment, the sequential rotation optionality (LHCP vs RHCP) is performed by only adjusting the phase offset of 2 (instead of 4) of the components and includes a 180 degree (or sign change) phase offset change of the two antenna elements.

For an embodiment, a static sequential rotation operates with each antenna element having a fixed trace with fixed length/delay producing a fixed phase offset and two traces having parallel trace routing with different lengths enabling 180 phase offset for the sign change. In addition, static sequential rotation assembly requires physical patches having a rotation of 90 degrees to obtain the desired RHCP/LHCP operation of the single element in accordance with the sequential rotation 90 degrees sign. For an embodiment, in a dynamic sequential rotation each antenna element has two possible excitation feed elements, 90 degrees relative to each other, located under (adjacent) the element, which are switched between via software leading to RHCP/LHCP operation of the single element. For an embodiment, the dynamic sequential rotation includes four traces, including two fixed traces, and two traces with two switches for each, wherein the two switches allow for production of either positive or negative 90 degree offsets. For an embodiment, the excitation feed element selection and phase sign selection are synchronized via software.

For an embodiment, an electromagnetic beam formed by the phased array is directed by selecting between different length traces of the printed circuit board. For an embodiment, the beam direction is selecting by phase shifting, switching and control. As previously described, for an embodiment, the phase shifting is achieved by switching between different length PCB traces (0, 90, 180 degrees) to enable steering in 9 different directions (zenith, N, E, S, W, NE, SE, SW, NW).

Figure 7:
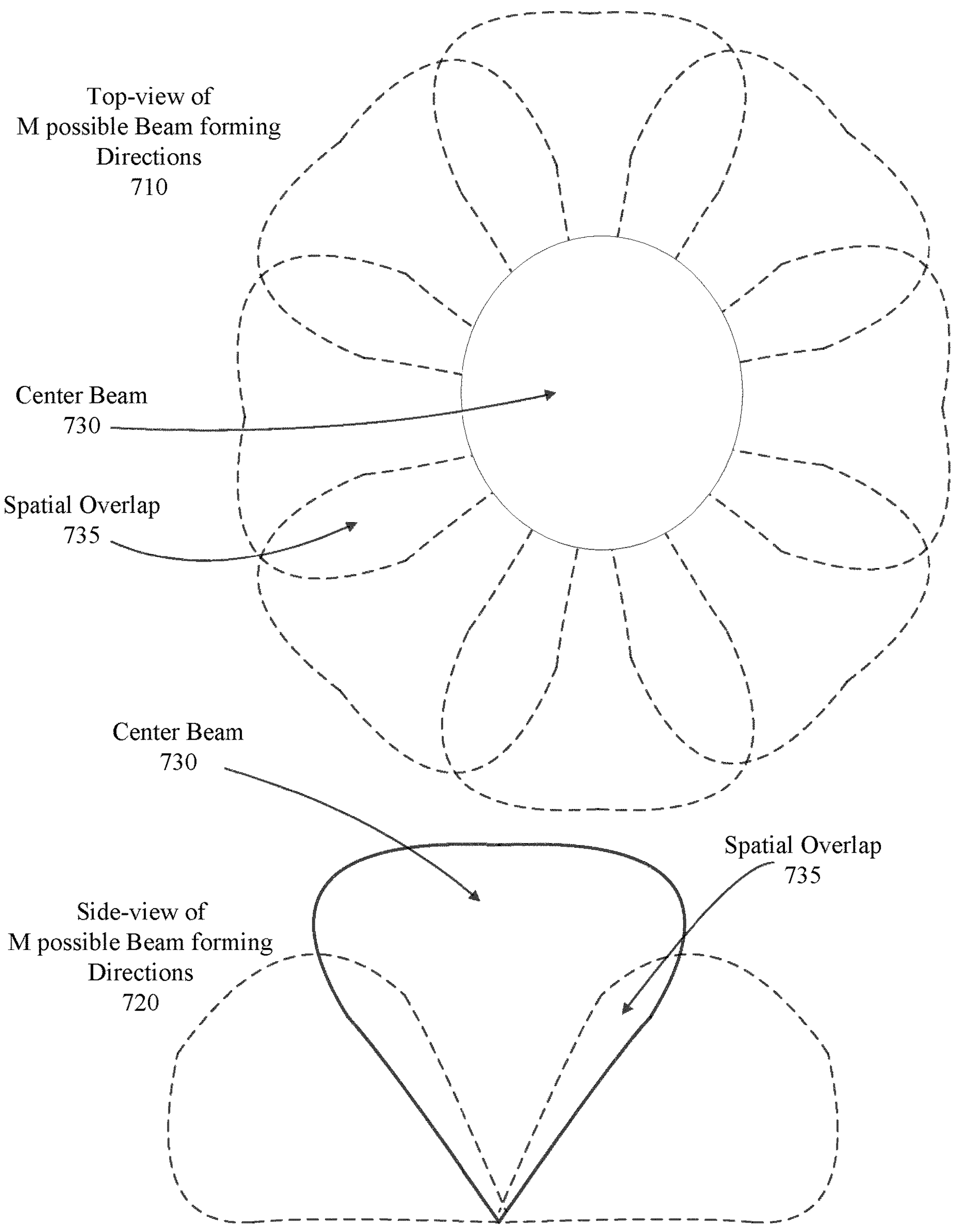
FIG. 7 shows M possible beamforming directions of the multiple antennas of the multiple layer printed circuit board, according to an embodiment.

FIG. 7 shows M possible beamforming directions 710 of the multiple antennas of the antenna assembly, according to an embodiment. For an embodiment, the multiple layer PCB/antenna assembly or a package that includes the multiple layer PCB/antenna assembly is attached to a mobile device. Accordingly, the physical orientation of the multiple layer PCB can constantly and rapidly change. In order for the multiple antennas of the multiple layer PCB to maintain a wireless link of a desired signal quality with a satellite, a direction of a beam formed by the multiple antennas needs to be able to adaptively update, modify, or change an orientation of the beam formed by the multiple antennas. For at least some embodiments, the directional beamforming is achieved by the previously described control signals manipulating the previously described switches (associated with the phase shifters) to route RF signals down varying length traces to produce phase shifts in RF signals coupled to the N antenna elements.

For an embodiment, the M beam directions form a half-spherical set of possible beam directions. FIG. 7 shows 9 possible beam directions, but any number of beam directions can be used. Each of the different beams provides a different beamforming direction. For an embodiment, the different beamforming directions are determined by phase shifters associated with the RF chains. As shown, the top-view of the M beam directions includes a center beam 730. Further, FIG. 7 shows a side-view of the M possible beamforming directions 720 including the center beam 730.

For an embodiment, the N antenna elements operate to form a pseudo-directional beam. For an embodiment, the pseudo-directional beam is selectable to be directed to at least one of M possible directions as determined by the phase shifters of the RF chains, wherein the M possible directions cover a half spherical combination of beam directions. Further, a spatial overlap 735 between the pseudo-directional beam of the M possible directions are selected to provide maintenance of a wireless link between the apparatus (a device of the antenna assembly) and a base station through a satellite while the apparatus is subjected to motion having a slew rate of the motion of at least a threshold.

For an embodiment, the N antenna elements that operate to form the M possible beams is associated with a processing unit and an IMU (internal measurement unit that includes, for example, an accelerometer, a gyroscope, and an optional magnetometer) and a GPS (global positioning system) receiver. For an embodiment, the IMU determines an absolute orientation of the antenna elements (or a device the antenna elements are attached to), and based upon the location of the radiating (transmitting) elements (for example, a user device antenna that includes the antenna elements) and receiving (for example, an uplink satellite) elements informs the processing unit how to control the switches to form/select the maximal gain/direction beam of the antenna elements. That is, the processing unit or controller associated with the antenna elements selects the operational beam formed (for example, a one of the M (9) possible beam directions) by the antenna elements based on the sensed orientation of the antenna elements, a location of the antenna elements, and a location of the satellite the antenna elements are facilitating wireless communication.

For an embodiment the antenna elements are associated with a processing unit and an RSSI (receive signal strength indicator) sensor, which the processing unit scans (via the control signals) through the 9 different beam configurations and selects the beam with the highest RSSI. For an embodiment, the best (selected) beam direction provides the greatest receive signal strength.

Figure 8:
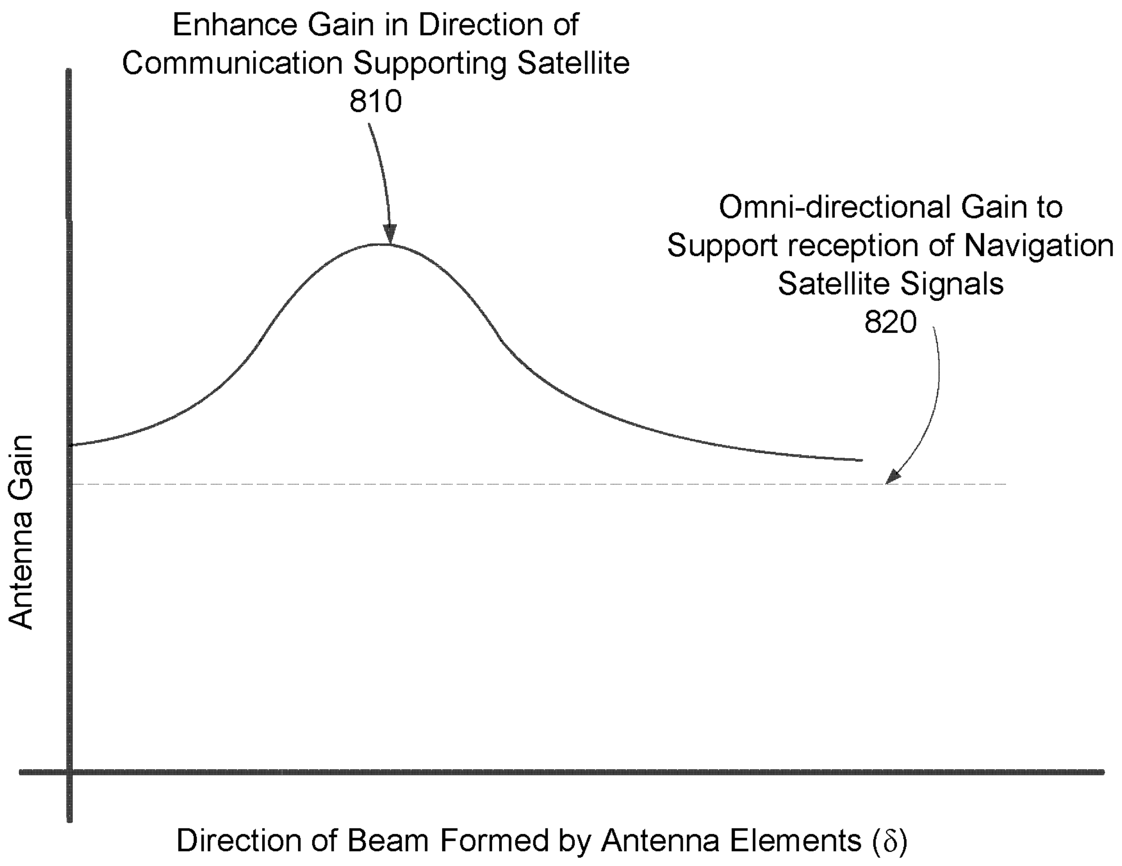
FIG. 8 is a curve that shows antenna gain of each of the M possible beamforming directions relative direction, according to an embodiment.

FIG. 8 is a curve 810 that shows antenna gain of each of the M possible beamforming directions relative to direction, according to an embodiment. That is, the curve 810 represents the antenna gain versus direction from the apparatus that includes the N antenna elements. As stated, the curve represents the antenna gain for each of the M possible beams. As shown, for an embodiment, the N antenna elements operate to enable formation of a pseudo-directional beam. That is, each beam is designed to have an enhanced gain in a specific direction similar to a direction antenna, but still have enough omni-directional gain to maintain at least an acceptable level of omni-directional gain in all other directions. The curve 810 shows the enhanced level of antenna gain in a specific direction while still maintaining at least a specified omni-directional gain 820 to support, for example, reception of wireless signals from navigational satellites.

Figure 9:
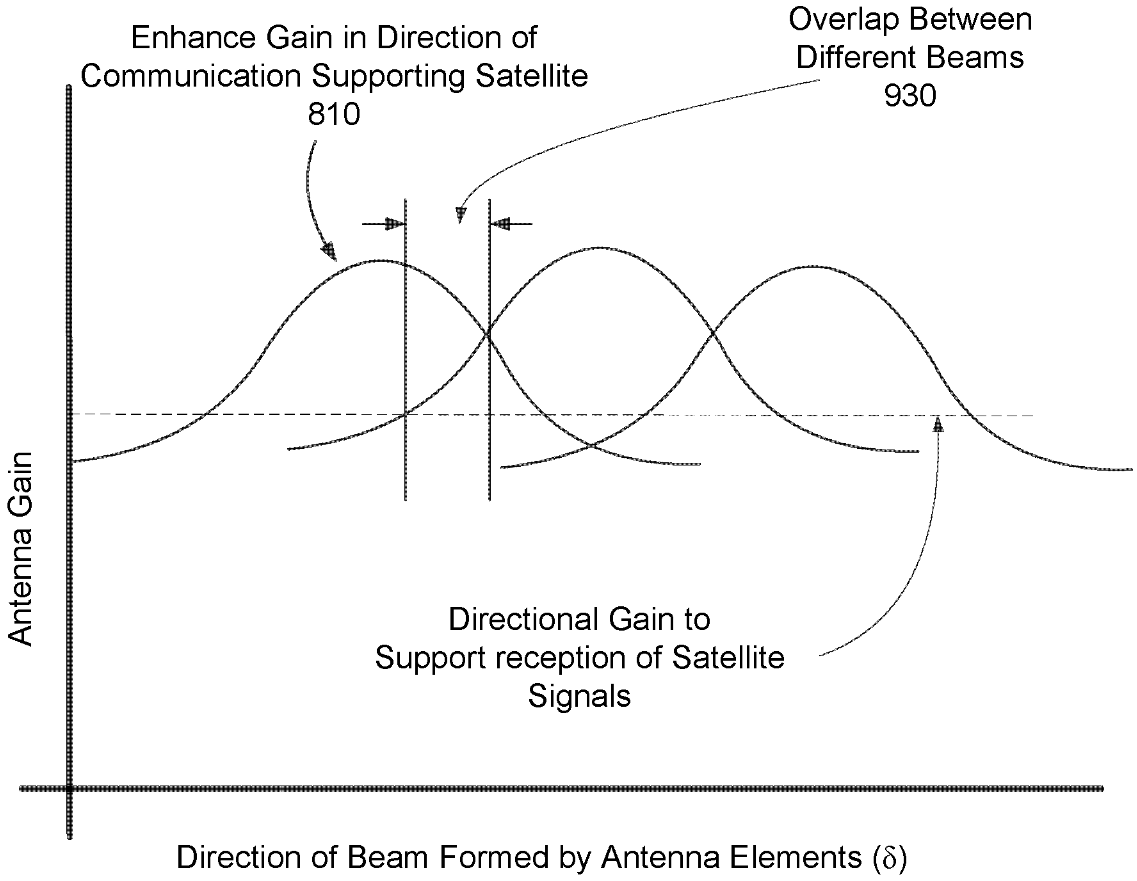
FIG. 9 show curves of antenna gains of multiple of the M possible beamforming directions, and shows an overlap between the gains of the multiple beamforming directions relative to direction, according to an embodiment.

FIG. 9 show curves of antenna gains of multiple of the M possible beamforming directions, and shows an overlap 930 between the gains of the multiple beamforming directions relative to direction, according to an embodiment. As previously stated, for an embodiment, the pseudo-directional beam is selectable to be directed to at least one of M possible directions as determined by the phase shifters of the RF chains, wherein the M possible directions cover a half spherical combination of beam directions. Further, as previously stated, for an embodiment, the spatial overlap 930 between the pseudo-directional beam of the M possible directions is selected to provide maintenance of a wireless link between the apparatus and a base station through a satellite while the apparatus (that is, the N antenna elements) is subjected to motion having a slew rate of the motion of at least a threshold. That is, as a device (attached, for example, to the apparatus) associated (for example, connected to) changes its orientation, different pseudo-omnidirectional directions need to be selected. Further, between selections, a desired level of antenna gain needs to be maintained. This is enabled by selecting the omni-directional beams such that neighboring omni-directional beams have an overlap to ensure a desired level of antenna gain between the switching of one omni-directional beam to another. For an embodiment, a subset of the M possible directions is activated at a time.

For at least some embodiments, the pseudo-directional beam is selected to include enough directional gain to enhance transmission from the apparatus through a wireless satellite link to a base station over a first carrier frequency. That is, the communication between the apparatus and the satellite includes a first carrier frequency, and the design (orientation, size, relative orientation) of the N antenna elements and/or the N conductive patches is selected to allow generation of the pseudo-directional beam that facilitates a wireless link between the apparatus and the satellite of at least a desired or required wireless link quality.

For at least some embodiments, the pseudo-directional beam is selected to include enough omni-directional gain to support reception through a plurality of wireless satellite links over at least a second carrier frequency. That is, for an embodiment, the carrier frequencies of wireless navigational satellite communication (for example, reception of GPS (global positioning system) signals) are different than the first carrier frequencies. Accordingly, in order for the apparatus to support both communication through the communication satellite and reception of the navigation satellite signals, the design (orientation, size, relative orientation) of the N antenna elements and/or the N conductive patches is selected to allow generation of the pseudo-directional beam that facilitates a wireless link between the apparatus and the satellite of at least a desired or required wireless link quality, and reception of the navigation satellite wireless signals of at least a desired or required wireless link quality.

For at least some embodiments, the directional gain of the pseudo-directional beam is selected to be greater at a direction of a communication supporting satellite link than for other directions. For at least some embodiments, the omni-directional gain of the pseudo-directional beam is selected to be greater than a threshold for a plurality of directions corresponding to directions of satellites of one or more navigational systems.

Figure 10:
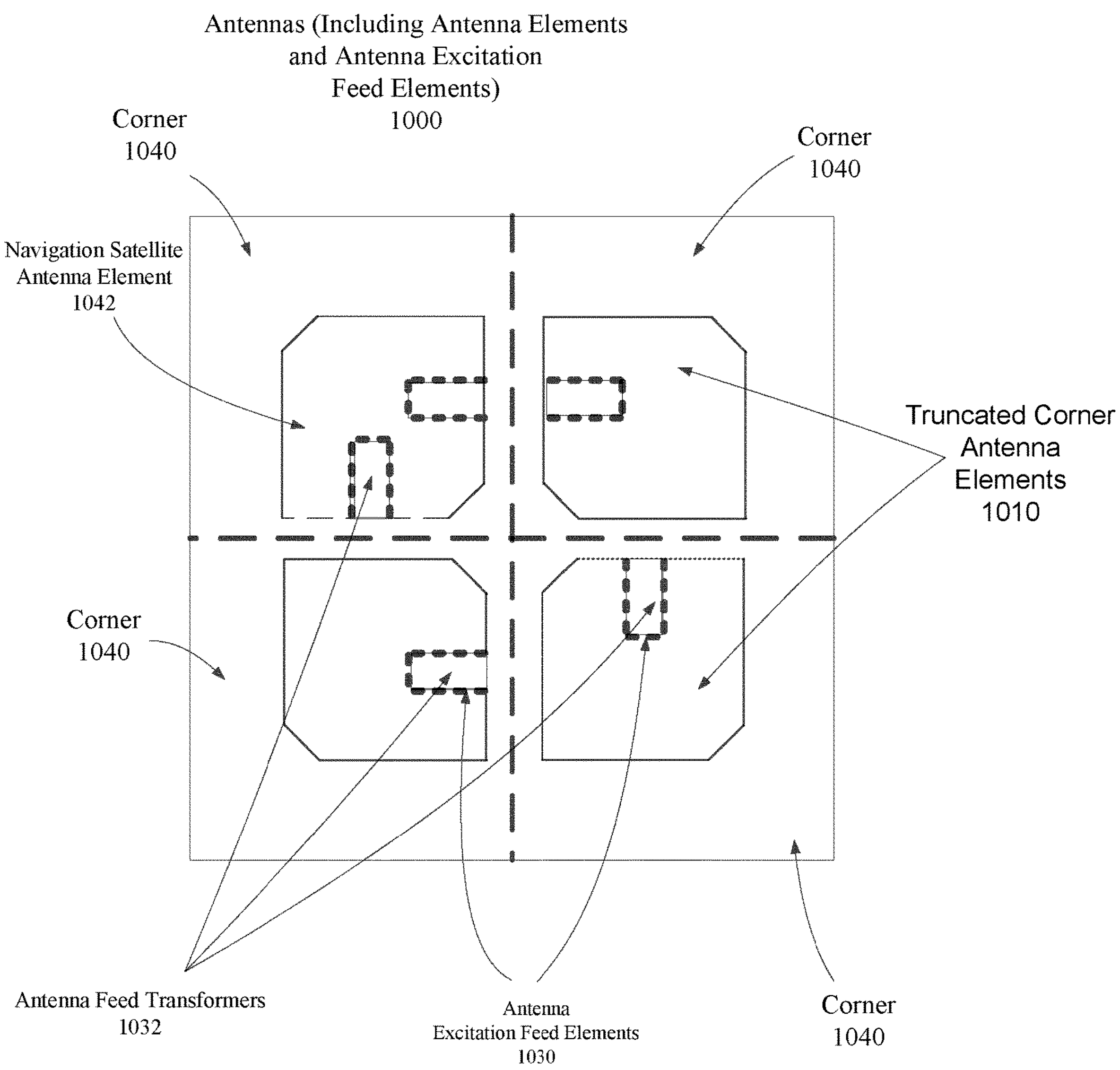
FIG. 10 shows multiple truncated corner antenna elements, element patches of the previously described antenna excitation feed elements, and antenna feed transformers, according to an embodiment.

FIG. 10 shows multiple truncated corner antenna elements 1010, element patches 1030 of the previously described antenna excitation feed elements 140, and antenna feed transformers 1032, according to an embodiment. For an embodiment, the antenna excitation feed elements 140 each include a rectangular element patch 1030. For an embodiment, the antenna elements 1010 are located so that a gap that includes a spacing or cavity (for example, the air gap) exists between the antenna elements 1010 and the element patch 1030 of the antenna excitation feed elements. Further, the feed element transformers 1032 of a different layer are shown. For an embodiment, the antenna excitation feed elements 1030 are formed to be 90 degrees relative to each other. That is, each antenna excitation feed element 1030 is physically rotated 90 degrees from one element to the next along the exterior perimeter of the phased array. For example, each antenna excitation feed element is rotated 90 degrees when progressing clockwise along the perimeter of the phased array, and −90 degrees when progressing counterclockwise. Note that an antenna element 1042 dedicated to navigation satellite communication includes two excitation feed elements and two antenna feed transformers 1032.

As previously described, for an embodiment, associated with each one of the antenna elements are RF active elements (such as, power amplifiers, low noise amplifiers, the previously described switches for controlling phase shift). The RF active elements are connected to transmission lines and the plated through hole vias to the antenna element feedlines 1030 of each of the antenna elements.

For an embodiment, four antenna elements form the antenna array 1000. For at least some embodiments, the distance between each of the antenna elements is designed in such a way to create the most effective bandwidth to cover transmit and receive frequencies with the same elements. As described, for an embodiment, each antenna excitation feed element 1030 operates with a specific orientation with relation to the other antenna excitation feed elements and the truncated corner antenna elements 1010 to circularly polarize the radiated signal.

As shown, for an embodiment, the antenna elements 1010 are each located in a corner 1040 and include truncated corners that enable circular polarization with a single feed through the elimination of symmetry around multiple axes. For an embodiment, one of the antenna elements 1042 (upper left corner) includes two feed elements and the rest of the antenna elements include a single feed element. For an embodiment, the antenna element having the two feed elements is utilized for reception of navigation satellite (GNSS) wireless signals.

Figure 11:
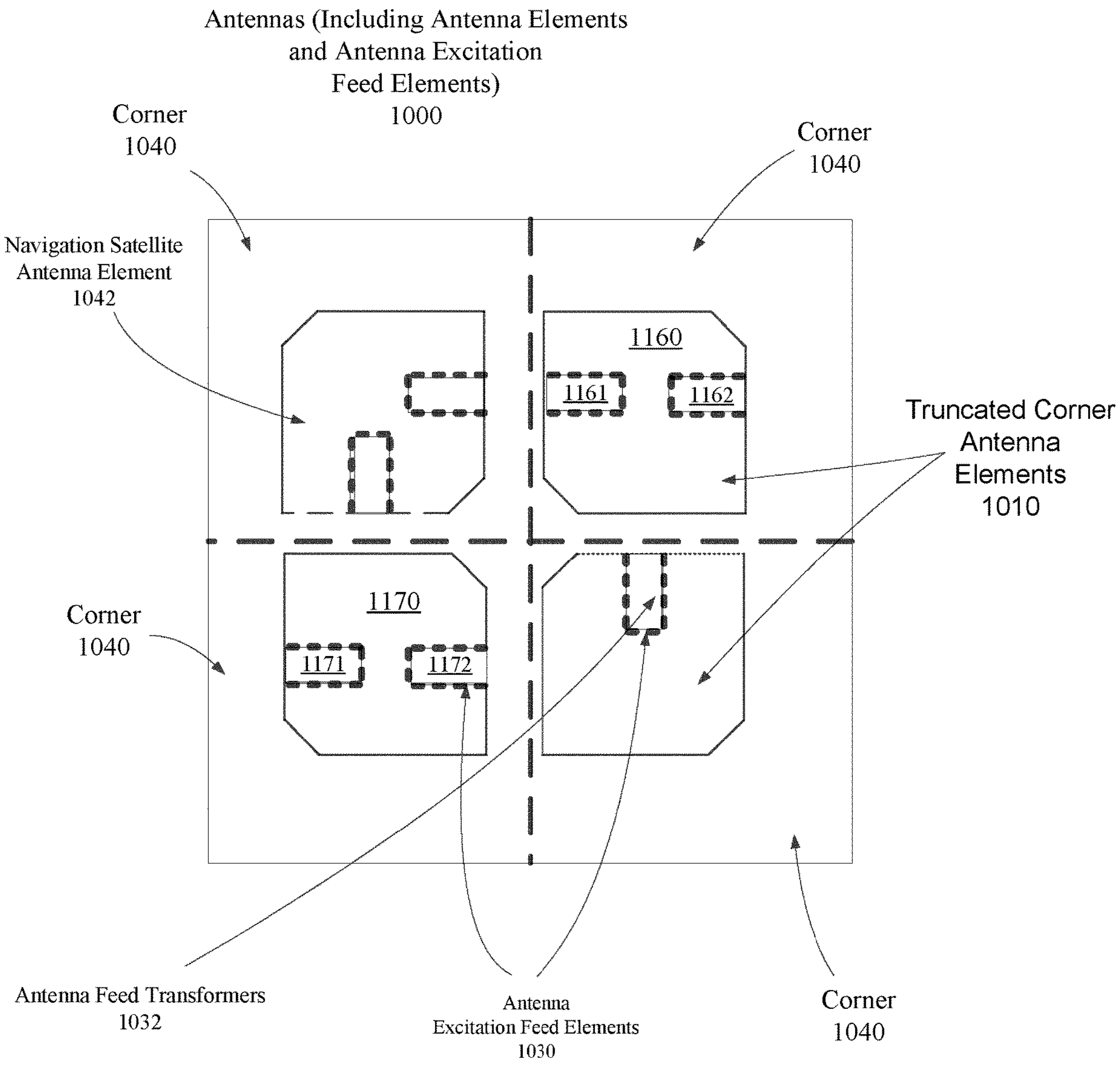
FIG. 11 shows multiple truncated corner antenna elements, element patches of the antenna excitation feed elements, antenna feed transformers 1032, and further includes a switched selection of a subset of the antenna excitation elements to produce a different (left vs right) circular polarization in the radiated signal, according to an embodiment.

FIG. 11 shows multiple truncated corner antenna elements 1010, element patches 1030 of the previously described antenna excitation feed elements 140, and antenna feed transformers 1032, and further includes a switched selection of a subset of the antenna excitation elements to produce a different (left vs right) circular polarization in the radiated signal, according to an embodiment. As shown, truncated antenna elements 1160, 1170 include antenna excitation feed elements 1161, 1162, 1171, 1172 which are switchable selected to produce the different circular polarization. That is, either 1161 or 1162 is selected, and either 1171 or 1172 are selected for operational use. The selection determines whether left or right circular polarization is selected.

Figure 12:
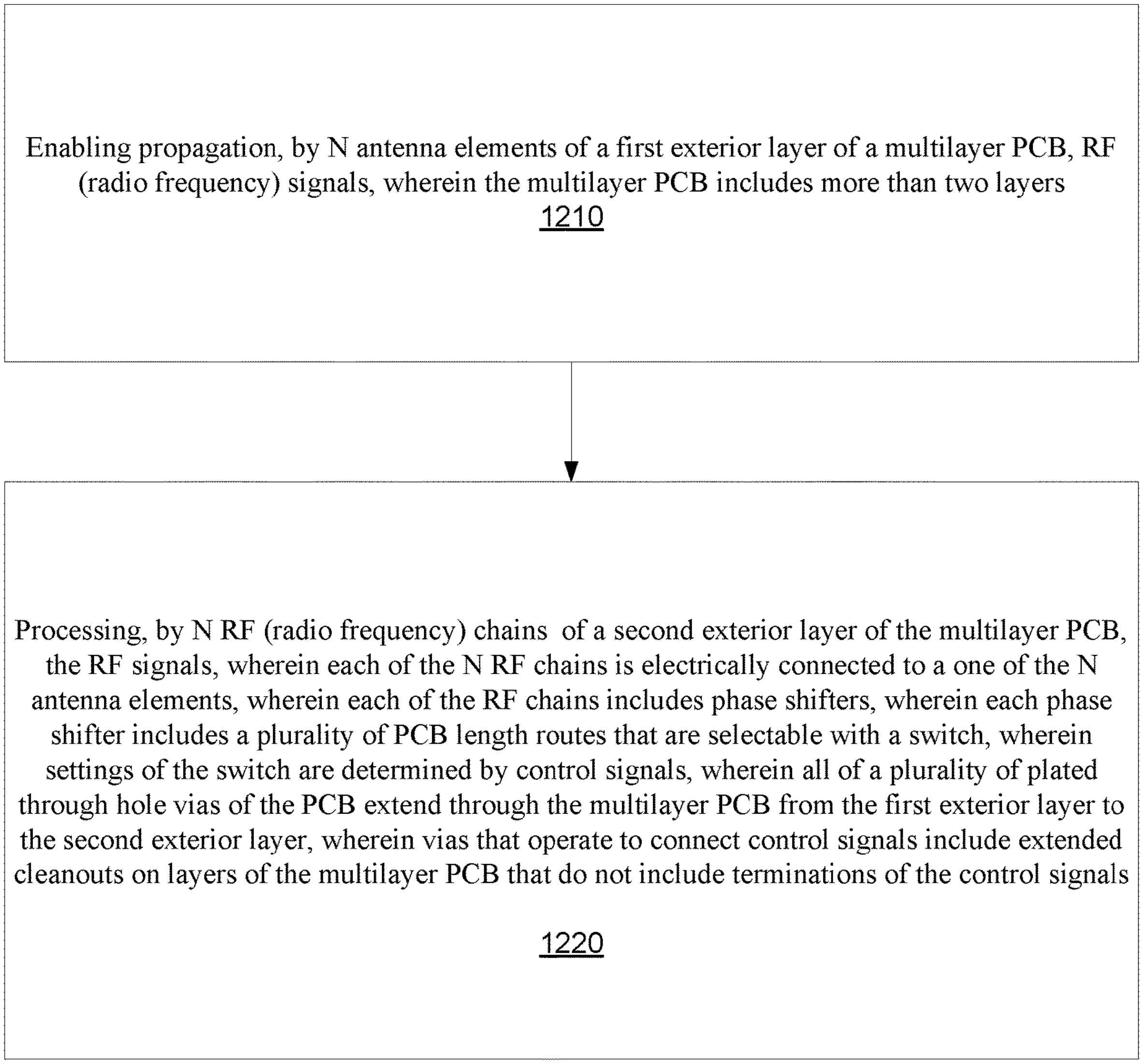
FIG. 12 is a flow chart that includes steps of a method enabling propagation of RF (radio frequency) signals by a multiple layer printed circuit board, according to an embodiment.

FIG. 12 is a flow chart that includes steps of a method enabling propagation of RF (radio frequency) signals by a multiple layer printed circuit board, according to an embodiment. A first step 1210 enabling propagation, by N antenna elements of a first exterior layer of a multilayer PCB, RF (radio frequency) signals, wherein the multilayer PCB includes more than two layers. A second step 1220 includes processing, by N RF (radio frequency) chains of a second exterior layer of the multilayer PCB, the RF signals, wherein each of the N RF chains is electrically connected to a one of the N antenna elements, wherein each of the RF chains includes phase shifters, wherein each phase shifter includes a plurality of PCB length routes that are selectable with a switch, wherein settings of the switch are determined by control signals. For at least some embodiments, all of a plurality of plated through hole vias of the PCB extend through the multilayer PCB from the first exterior layer to the second exterior layer, wherein vias that operate to connect control signals include extended cleanouts on layers of the multilayer PCB that do not include terminations of the control signals.

At least some embodiments further include enabling, by N metal patches (antenna elements), communication with a satellite, wherein the N metal patches are arranged in a square, wherein an air gap is located between the N metal patches (antenna elements) and N antenna excitation feed elements, wherein dimensions, orientation, and spacing between the N metal patches and the N antenna excitation feed elements are selected based on a carrier frequency, bandwidth, and directionality of the propagated RF signals.

As previously described, for at least some embodiments, the N antenna elements operate to enable formation of a pseudo-directional beam. As previously described, for at least some embodiments, the pseudo-directional beam is selectable to be directed to at least one of M possible directions as determined by the phase shifters of the RF chains, wherein the M possible directions cover a half spherical combination of beam directions, and wherein a spatial overlap between the pseudo-directional beam of the M possible directions are selected to provide maintenance of a wireless link between the apparatus and a base station through a satellite while the apparatus is subjected to motion having a slew rate of the motion of at least a threshold. As previously described, for at least some embodiments, the pseudo-directional beam is selected to include enough directional gain to enhance transmission from the apparatus through a wireless satellite link to a base station over a first carrier frequency, and wherein the pseudo-directional beam is selected to include enough omni-directional gain to support reception through a plurality of wireless satellite links over at least a second carrier frequency.

As previously described, for an embodiment, the N antenna elements that operate to form the M possible beams is associated with a processing unit and an IMU (internal measurement unit that includes, for example, an accelerometer, a gyroscope, and an optional magnetometer) and a GPS (global positioning system) receiver. For an embodiment, the IMU determines an absolute orientation of the antenna elements (or a device the antenna elements are attached to), and based upon the location of the radiating (transmitting) elements (for example, a user device antenna that includes the antenna elements) and receiving (for example, an uplink satellite) elements informs the processing unit how to control the switches to form/select the maximal gain/direction beam of the antenna elements. That is, the processing unit or controller associated with the antenna elements selects the operational beam formed (for example, a one of the M (9) possible beam directions) by the antenna elements based on the sensed orientation of the antenna elements, a location of the antenna elements, and a location of the satellite the antenna elements are facilitating wireless communication.

Further, as previously described, for an embodiment the antenna elements are associated with a processing unit and an RSSI (receive signal strength indicator) sensor, which the processing unit scans (via the control signals) through the 9 different beam configurations and selects the beam with the highest RSSI. For an embodiment, the best beam direction provides the greatest receive signal strength.

Figure 13:
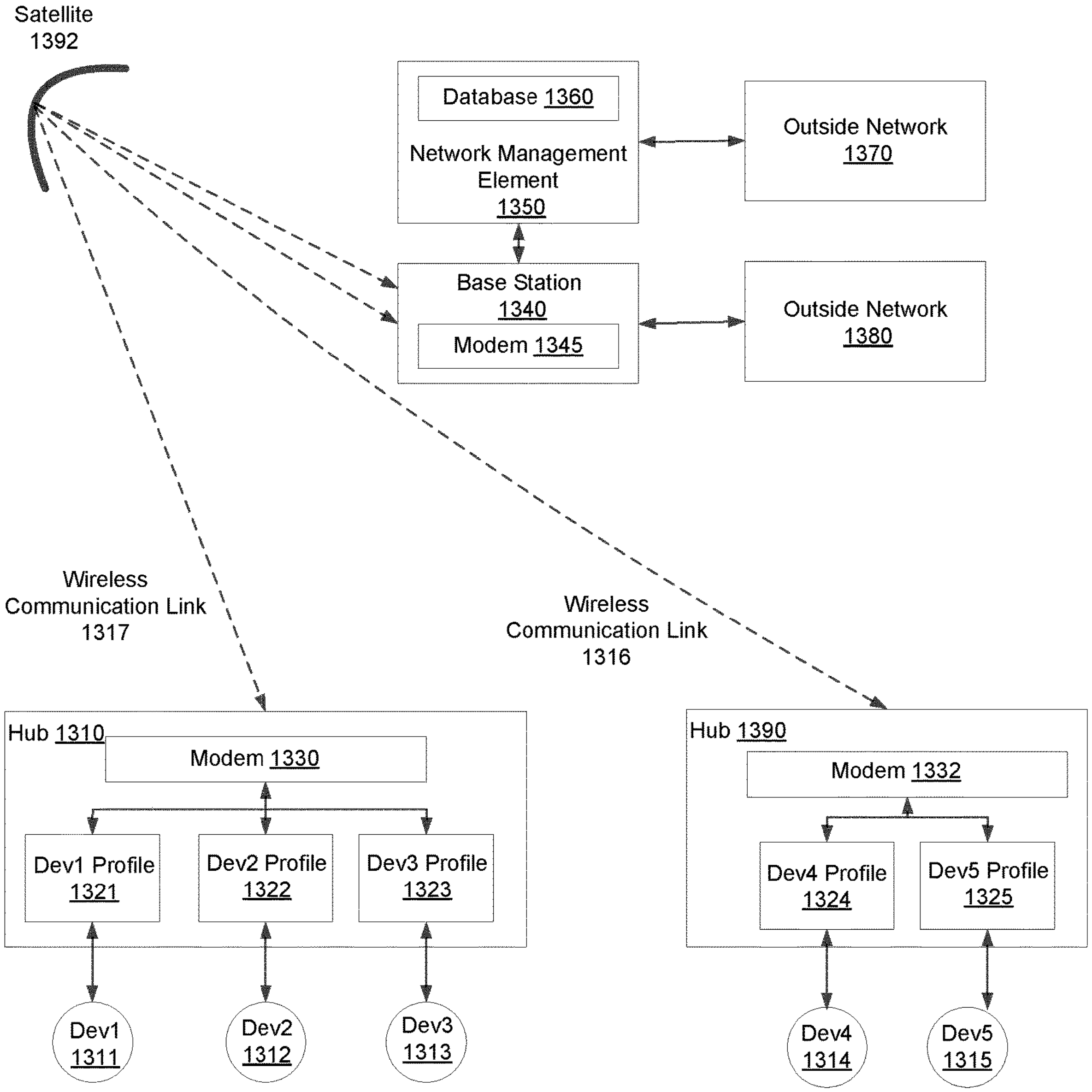
FIG. 13 shows a plurality of hubs that include modems that each include an antenna assembly that includes a multiple layer printed circuit board, according to an embodiment.

FIG. 13 shows a plurality of hubs 1310, 1390 that include modems that each include an antenna assembly that includes a multiple layer printed circuit board, according to an embodiment. For an embodiment, the plurality of hubs 1310, 1390 communicate data of data sources 1311, 1312, 1313, 1314, 1315 through satellite link(s) 1316, 1317 to a base station 1340. As shown, the data sources 1311, 1312, 1313, 1314, 1315 are connected to the hubs 1310, 1390. The hubs 1310, 1390 communicate through modems 1330, 1332 to a modem 1345 of the base station 1340 through the wireless satellite links 1316, 1317. The base station may also communicate with outside networks 1370, 1380. For an embodiment, the wireless satellite links 1316, 1317 reflectively pass through a satellite 1392.

It is to be understood that the data sources 1311, 1312, 1313, 1314, 1315 can vary in type, and can each require very different data reporting characteristics. The wireless satellite links 1316, 1317 links are a limited resource, and the use of this limited resource should be judicious and efficient. In order to efficiently utilize the wireless satellite links 1316, 1317, each of the data sources 1311, 1312, 1313, 1314, 1315 are provided with data profiles (shown as Dev profiles as a profile may be allocated for each device) 1321, 1322, 1323, 1324, 1325 that coordinate the timing (and/or frequency) of reporting (communication by the hubs 1310, 1390 to the base station 1340 through the wireless satellite links 1316, 1317) of the data provided by the data sources 1311, 1312, 1313, 1314, 1315.

For an embodiment, a network management element 1350 maintains a database 1360 in which the data profiles 1321, 1322, 1323, 1324, 1325 can be stored and maintained. Further, the network management element 1315 manages the data profiles 1321, 1322, 1323, 1324, 1325, wherein the management includes ensuring that synchronization is maintained during the data reporting by the hubs 1310, 1390 of the data of each of the data sources 1311, 1312, 1313, 1314, 1315. That is, the data reported by each hub 1310, 1390 of the data of the data sources 1311, 1312, 1313, 1314, 1315 maintains synchronization of the data reporting of each of the data sources 1311, 1312, 1313, 1314, 1315 relative to each other. Again, the network management element 1350 ensures this synchronization through management of the data profiles 1321, 1322, 1323, 1324, 1325. The synchronization between the data sources 1311, 1312, 1313, 1314, 1315 distributes the timing of the reporting of the data of each of the data sources 1311, 1312, 1313, 1314, 1315 to prevent the reporting of one device from interfering with the reporting of another device, and provides for efficiency in the data reporting.

For at least some embodiments, the network management element 1350 resides in a central network location perhaps collocated with multiple base stations and/or co-located with a network operations center. For an embodiment, the network management element 1350 directly communicates with the base station 1340 and initiates the transfer of data profiles across the network via the base station 1340 to the hubs 1310, 1390.

For at least some embodiments, data profiles are distributed when new hubs are brought onto the network, when hubs change ownership, or when the hubs are re-provisioned. Other changes to data profile contents outside of these situations are more likely addressed by sync packets (for an embodiment, a sync packet is a packet to update the value of a specific field inside of a data profile, but not necessarily updating the structure of the data profile) where only small changes to profile fields are required.

As described, the data profiles 1321, 1322, 1323, 1324, 1325 control timing of when the hubs 1310, 1390 communicate the data of the data sources 1311, 1312, 1313, 1314, 1315 through wireless satellite links 1316, 1317 (shared resource). Accordingly, the described embodiments coordinate access to the shared network resource (wireless satellite links 1316, 1317) to ensure optimal usage of the network resource to avoid collisions between packets, the transmission of redundant information, and to reshape undesired traffic profiles.

For at least some embodiments, the data profiles allow for the elimination of redundant data channel setup information which is already contained inside the data profile, which then are no longer needed to be shared upon the initiation of every packet sent across the network. This information may include the transmission size, sub-carrier (frequency) allocation, MCS (modulation and coding scheme) selection, and timing information. The result of this is a reduction in data resources consumed by the network to send a packet of data. In the example of sending a GPS data packet containing x, y, z, and time, the amount of redundant channel setup information is 8× larger than the actual GPS data packet of interest, resulting in a very inefficient network for large volumes of narrowband traffic. Additionally, in the realm of satellite communications, the elimination of unnecessary channel setup messages reduces the latency between the initiation of sending, for example, a GPS packet across the network and actually receiving that packet by roughly half. For example, a normally 3 second latency can be reduced to as low as 0.25 seconds.

While FIG. 13 shows each hub 1310, 1390 as including more than one data source, it is to be understood that each hub may include a single data source. Further, the data of a single data source may be treated differently based on the profile. That is, different data packets of the single data source may be reported, or communicated differently based on the profile of the data device. For example, some data of the data source may be reported or communicated periodically, whereas different data of the data source may be reported or communicated in real time. For an embodiment, characteristics or properties of the data determine or influence the timing of the communication of the data from the hub of the data source.

Further, while FIG. 13 shows the hubs and the data sources possibly being separate physical devices, it is to be understood that the hub and one or more data devices may actually be a single physical device.

Although specific embodiments have been described and illustrated, the embodiments are not to be limited to the specific forms or arrangements of parts so described and illustrated. The described embodiments are to only be limited by the claims.

What is claimed:

1. An antenna assembly, comprising:

a multiple layer printed circuit board comprising antenna excitation feed elements, wherein the antenna excitation feed elements are located on a layer of the multiple layer printed circuit board;

a dielectric plate, wherein a second surface of the dielectric plate is affixed to a first surface of multiple layer printed circuit board forming gaps adjacent each of the antenna excitation feed elements, wherein a dielectric constant of the dielectric plate, a thickness of the dielectric plate, and a thickness of the gaps are selected based on an operating frequency of wireless signals communicated through the antenna assembly, and based on RF (radio frequency) characteristics of the multilayer printed circuit board; and a plurality of N antenna elements, each of the plurality of N antenna elements affixed to a first surface of the dielectric plate, wherein each of the plurality of N antenna elements is located on the first surface based upon a location of at least one of the antenna excitation feed elements.

2. The assembly of claim 1, wherein each of the gaps comprises an air gap.

3. The assembly of claim 1, further comprising:

a radome, the radome affixed to the first surface of the dielectric plate, forming a second gap between the radome and the second surface of the dielectric plate, wherein a dielectric constant of the radome and a thickness of the second gap are selected based on the operating frequency of wireless signals communicated through the antenna assembly, and based upon the RF (radio frequency) characteristics of the multilayer PCB board.

4. The assembly of claim 3, further comprising radome ribs located between the radome and the antenna elements.

5. The assembly of claim 4, wherein the radome ribs provide stability to the assembly when the radome has been secured to the dielectric plate, the multilayer PCB, or a housing that secures the dielectric plate and the multilayer PCB.

6. The assembly of claim 3, wherein an antenna gain of the plurality of N antenna elements and steering of an electromagnetic beam formed by the plurality of N antenna elements are augmented by the radome affixed to the dielectric plate.

7. The assembly of claim 1, wherein the characteristics of the multilayer PCB board comprise at least a dielectric constant of the multilayer PCB board and a thickness of the multilayer PCB board.

8. The assembly of claim 1, wherein each of the N antenna elements is located within (formed within) the dielectric plate, wherein each of the N antenna element includes a conductive patch, wherein each of the conductive patches is physically separated from other of the conductive patches by portions of the dielectric plate, wherein a depth of each of the antenna elements into the dielectric plate is based on a thickness of the antenna element.

9. The assembly of claim 8, wherein a surface area of each of the N antenna elements does not protrude past a surface area of the dielectric plate.

10. The assembly of claim 1, wherein the dielectric plate comprises an edge lip that forms and ensconces each of the gaps when the second surface of the dielectric plate is affixed to the first layer of multilayer printed circuit board, and wherein formation of the edge lip includes a compromise between mechanical stiffness of the dielectric plate and RF (radio frequency) performance of the dielectric plate.

11. The assembly of claim 1, multiple layer printed circuit board of claim 1, wherein the multiple layer printed circuit board further comprising:

a second layer comprising a ground plane;

a third layer comprising antenna feed transformers, wherein each of the antenna excitation feed elements is electrically connected to a one of the antenna feed transformers through a conductive via, wherein each of the antenna feed transformers provide impedance matching between each of the plurality of N antenna elements and a radio located within the multiple layer printed circuit board.

12. The assembly of claim 1, wherein an antenna element of the plurality of N antenna elements operates as a single antenna and other of the plurality of N antenna elements operate as multiple elements of an antenna as coordinated through time multiplexing.

13. The assembly of claim 1, wherein an antenna element of the plurality of N antenna elements operates as an omnidirectional antenna and other of the plurality of N antenna elements operate as a directional antenna as coordinated through time multiplexing.

14. The assembly of claim 13, wherein the omnidirectional antenna operates to receive navigation satellite signals, and the N antenna elements operate as the directional antenna for supporting wireless communication with users.

15. The assembly of claim 13, wherein the omnidirectional antenna operates using RHCP (right hand circular polarization) and the N antenna elements operating as the directional antenna dynamically switch between LHCP (left hand circular polarization) and RHCP.

16. The assembly of claim 1, wherein the antenna excitation feed elements are distributed over multiple layers of the multiple layer printed circuit board.

17. The assembly of claim 1, wherein the plurality of N antenna elements forms a phased array.

18. The assembly of claim 17, wherein the N antenna elements are operated using sequential rotation.

19. The assembly of claim 18, wherein sequential rotation optionality between LHCP (left hand circular polarization and RHCP (right hand circular polarization) is achieved by adjusting a phase offset of two of four antenna elements and prior selection of an orientation of each of the antenna elements.

20. The assembly of claim 18, wherein sequential rotation optionality between LHCP (left hand circular polarization and RHCP (right hand circular polarization) is achieved by adjusting a phase offset of two of four antenna elements and prior selection of excitation feed elements of each of the antenna elements.

21. The assembly of claim 17, wherein an electromagnetic beam formed by the phased array is directed by selecting between different length traces of the printed circuit board.

* * * * *